United States Patent [19]

Tailliet

[11] Patent Number: 5,016,078

[45] Date of Patent: May 14, 1991

[54] CMOS INTEGRATED CIRCUIT STRUCTURE PROTECTED AGAINST ELECTROSTATIC DISCHARGES

[75] Inventor: Francois Tailliet, Epinay sur Seine, France

[73] Assignee: SGS-Thomson Microelectronics S.A., Gentilly, France

[21] Appl. No.: 551,555

[22] Filed: Jul. 11, 1990

[30] Foreign Application Priority Data

Jul. 13, 1989 [FR] France .................. 89 09548

[51] Int. Cl.$^5$ ........................... H01L 27/02
[52] U.S. Cl. ........................ 357/42; 357/35; 357/48; 357/55; 357/68; 357/86
[58] Field of Search .............. 357/35, 43, 42, 48, 357/68, 86

[56] References Cited

U.S. PATENT DOCUMENTS

| | | | |
|---|---|---|---|
| 4,314,267 | 2/1982 | Bergeron et al. | 357/35 |
| 4,419,685 | 12/1983 | Sugawara et al. | 357/35 |
| 4,918,026 | 4/1990 | Kosiak et al. | 357/43 |

FOREIGN PATENT DOCUMENTS 2173037 10/1986 United Kingdom .
2210197 6/1989 United Kingdom .

*Primary Examiner*—Edward J. Wojciechowicz
*Attorney, Agent, or Firm*—Roland Plottel

[57] ABSTRACT

The disclosure concerns integrated circuits and, more particularly, their protection against electrostatic discharges. To protect a metallized pad in a CMOS circuit on an N substrate with P wells, an NPN type lateral bipolar transistor formed in a P-type well is used. The emitter is an N+ region connected to the pad. The collector is an N+ region connected to a metallization which is itself connected, like the substrate N, to the high supply voltage Vcc of the circuit. The well is taken to the potential of the pad to be protected by means of an ohmic contact by a P+ surface diffusion of the well. In the preferred embodiment of the invention, the region that acts as a collector includes a part extending laterally outside the P well, and it is in this external part that the contact with the metallization occurs. The contact is at a sufficient distance from the well for there to be no risk of damage to the trench/substrate junction when the density of current flowing through the metallization is high.

7 Claims, 3 Drawing Sheets

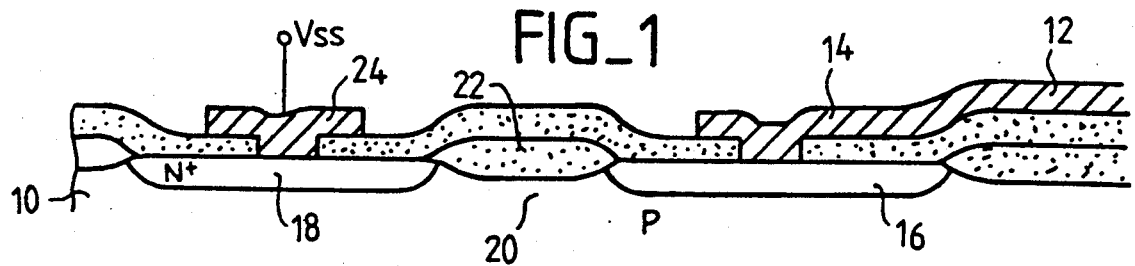
FIG_1
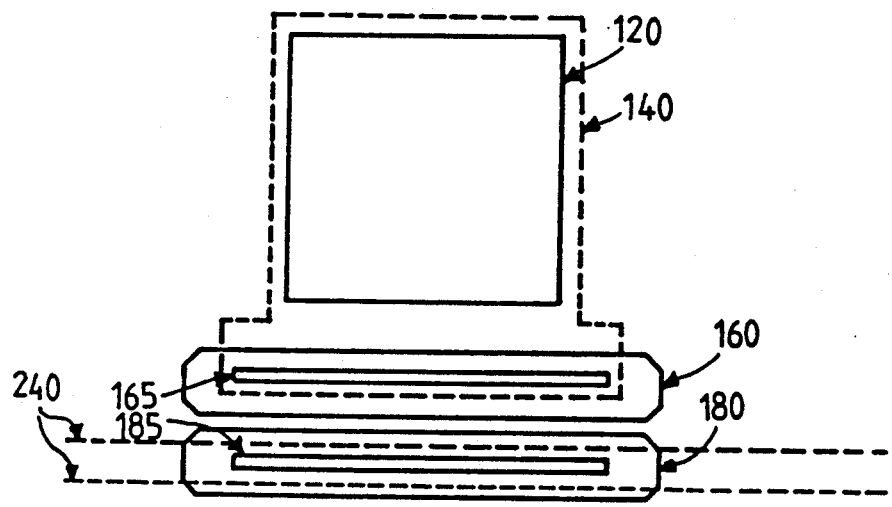
FIG_2
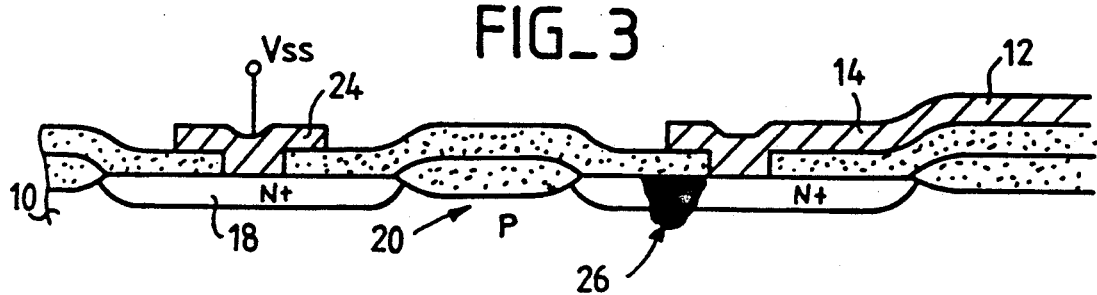
FIG_3
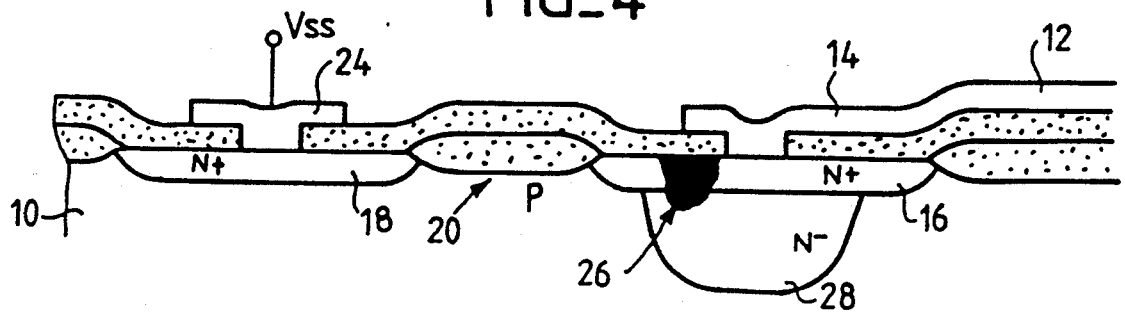
FIG_4

FIG_5
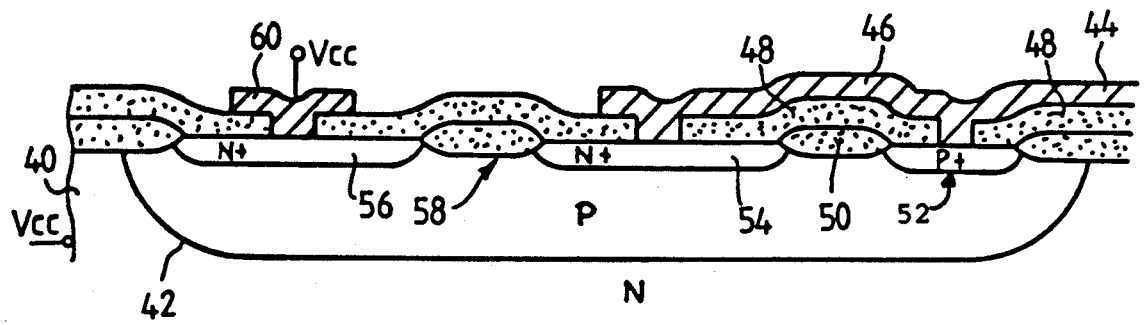
FIG_6
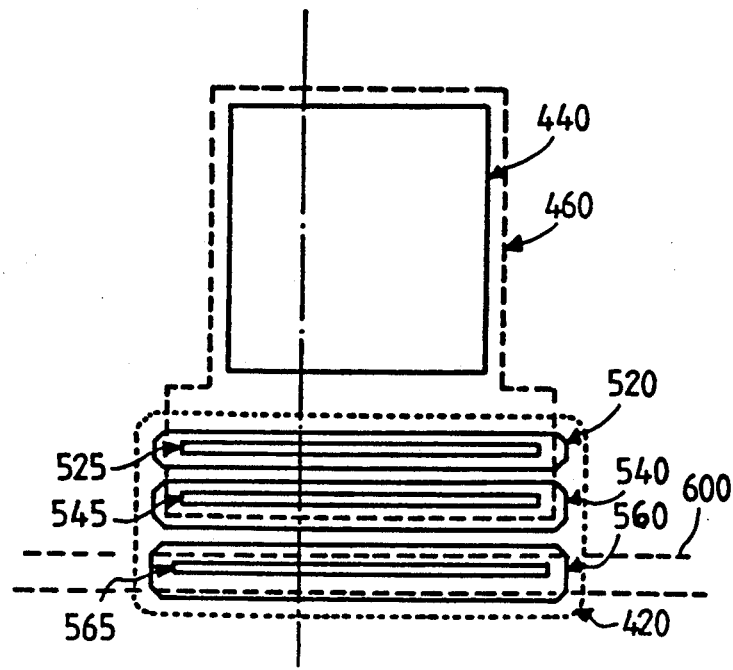

FIG_7
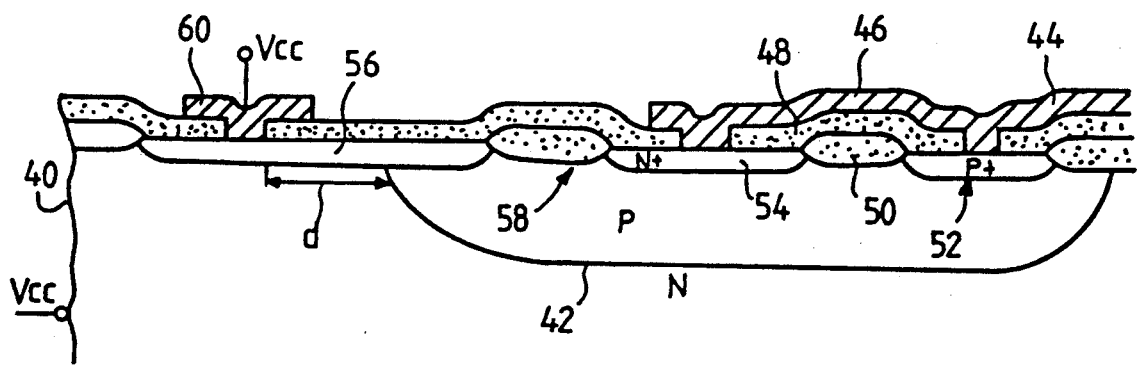
FIG_8
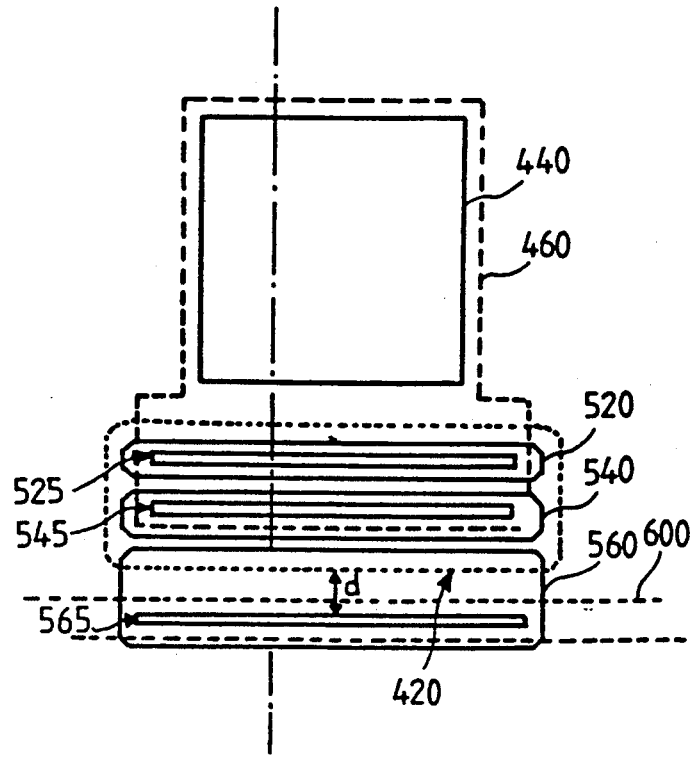

CMOS INTEGRATED CIRCUIT STRUCTURE PROTECTED AGAINST ELECTROSTATIC DISCHARGES

BACKGROUND OF THE INVENTION

1. Field of the Invention

The invention concerns integrated circuits.

The problem to be solved is that of protecting the circuit against electrostatic discharges which may destroy certain elements of the circuit.

These electrostatic discharges may result quite simply from the component's being handled by an operator whose hands are not connected to a fixed potential, to the ground for example. The discharges occur between the input/output terminals of the component. They are passed on into the integrated circuit through the metallized pads deposited on the substrate in which the circuit is formed. These pads are connected to the external input/output terminals, generally by soldered conductive wires.

To make the integrated circuits immune to the destructive effects of these discharges, specific circuit elements are placed close to the metallized pads. These circuit elements are used chiefly to deflect the electrostatic discharge currents in order to prevent them from flowing within more fragile elements.

These protection elements should be capable of deflecting the greatest possible energy without being themselves destroyed and, despite this, they should take up as little space as possible. For, they are necessarily very bulky and use up a large part of the available integrated circuit surface. It is desired to achieve the utmost possible restriction of the space taken up by them, in order to reserve surface space for the integrated circuit proper.

2. Description of the Prior Art

FIG. 1 shows an example of a protection structure in the case of an integrated circuit made by NMOS technology on a P-type substrate. The protection structure comprises essentially an NPN type lateral bipolar transistor, with its collector connected to a pad to be protected and its emitter connected to another pad or to a reference potential. The base is formed by a portion of the substrate itself.

In FIG. 1, the P-type substrate is designated by the reference 10 and the pad to be protected has the reference 12. This pad is connected by a portion of metallisation 14 to an N+ type zone 16, superficially diffused in the substrate. This zone 16 forms the collector of the lateral NPN protection transistor. The zone 16 is separated laterally from another superficial N+ type diffused zone, designated by the reference 18, forming the emitter of the lateral NPN transistor. A base region 20, formed by the P-type substrate, separates the regions 16 and 18. This base region 20 is covered with a thick insulator layer 22 (silicon oxide). The emitter zone 18 is connected by a metal contact 24, for example to a reference potential which is preferably the low supply potential Vss of the circuit. The substrate is also connected to Vss.

FIG. 2 is a top view showing the relative arrangement of the pad to be protected, the diffused zones and the metallisations. The contour 120 is the contour of the metal pad 12, as it appears when the entire structure is protected by an insulating passivation layer not shown in FIG. 1. This layer covers the entire circuit except for the aperture defined by the contour 120. The contour 140 represents the metallization connected to the pad 12, including the pad 12. The contour 160 represents the N+ type diffused zone 18. The narrow space between these two contours represents the base 20 of the lateral transistor. The contour 240 represents the metallization 24 connected to Vss. The contour 165 represents the aperture of the insulating layer by which the metallization 14 can come into contact with the zone 16. Finally, the contour 185 represents the aperture of the insulator layer by which the metallization 24 can come into contact with the diffused zone 18.

When the pad to be protected receives electrostatic discharges having a positive bias with respect to the substrate, the lateral bipolar transistor will become conductive by the setting up of an avalanche in its base/collector junction, and then by direct conduction between the collector and the emitter.

During discharges with negative bias, the diode formed by the N+ type diffused zone 16 and the P-type substrate will be conductive in forward bias. Furthermore, the lateral bipolar transistor could be triggered to boost the conduction.

The limitation of the performance characteristics of this type of protection often arises out of the thermal destruction, from a certain level of energy onwards, of the edges of the contact between the metallization 14 connected to the pad 12 and the diffused zone 16. The heating due to the discharge current flowing through the protection transistor prompts a local migration of the metal of the contact (generally aluminum) which may go so far as to put the N+P junction, located just below, into short-circuit. The heating is at its maximum level on the edge of the contact, and it is at this place that there is destruction of the junction. This junction is only at a very small depth of 0.3 to 0.5 micrometer approximately.

FIG. 3 shows the short-circuit region 26 created by this heating.

The circuit is then unusable because the pad to be protected is placed permanently at the potential of the substrate by this permanent short-circuit.

In CMOS technology on a P substrate, the operation of diffusing N− wells is used to created a deep N− type zone just beneath the contact between the metallization 16 and the diffused N+ region. This has the effect of shifting the NP junction much further below, the depth of the N− well being rather in the region of 4 to 5 micrometers. Even if the edges of the contact get heated with a resultant localised fusion of the contact beneath these edges, the aluminum does not reach the depth of 4 to 5 micrometers and the NP insulator junction between the pad and the substrate remains intact.

FIG. 4 shows this arrangement. The references are the same as in the previous Figures. It shows the N-type localised well 28 beneath the contact. The zone of fusion 26 does not reach the trench/substrate junction. The pad is not short-circuited with the substrate.

Consequently, the CMOS substrates with P substrate and N well can bear electrostatic discharges with far higher energy levels than the NMOS circuits.

If this protection structure has to be transposed to the case of CMOS circuits on N-type substrate with P-type wells, the idea that comes naturally to mind is that of inverting all the types of conductivity to make a structure similar to that of FIG. 4 where all the P regions are replaced by N regions and vice versa. This entails the assumption that the lateral NPN transistor is replaced by a PNP lateral transistor. Experience shows that this type of structure does not work well, undoubtedly because of the slower reaction time of the PNP structure and its limited ability to conduct a high current.

The invention is aimed at proposing a protection structure for CMOS circuits on N substrate with P wells, that is more efficient than those of the prior art.

SUMMARY OF THE INVENTION

According to the invention, it is proposed essentially to make a protection structure comprising an NPN type lateral transistor formed in a P well, the collector of the transistor being connected to a metallization, the emitter being connected to a pad to be protected, and a metallic ohmic contact being provided between the pad to be protected and the P-type well to take it to the potential of the pad.

The performance characteristics obtained with this structure are an improvement over those got with protection by lateral PNP transistor.

However, a very important additional improvement can be obtained by having the collector of the lateral transistor contain an N+ type diffused region, one part of which is within the P well and another part of which is outside, the contact between the collector and the metallization being made in the external part.

The contact is then placed laterally at a distance from the edge of the well, and it will be seen that this eliminates a risk of damage of a junction during a excessive flow of current through the collector metallization.

The distance d between the edge of the well and the edges of the collector metallization, at the place where it is in contact with the N+ collector region, is appreciably greater than the depth of the N+ diffused collector region. Preferably, it has several times this depth. For example, the distance is of the order of the depth of the P-type well.

The N+ type diffused regions acting as an emitter and a collector will be made at the same time as the source and drain regions of the N channel MOS transistors made on the CMOS technology integrated circuit.

The ohmic contact between the pad to be protected and the well shall be achieved by a P+ type diffusion made at the same time as the source and drain regions of the P channel transistors of the circuit.

BRIEF DESCRIPTION OF THE DRAWINGS

Other features and advantages of the invention will appear from the following detailed description, made with reference to the appended drawings, wherein:

FIGS. 1 to 4, already described, represent protection structures used in the prior art;

FIG. 5 shows a sectional view of a protection structure according to a first embodiment of the invention;

FIG. 6 shows a top view corresponding to the embodiment of FIG. 5;

FIG. 7 shows a sectional view of a structure according to a second embodiment of the invention;

FIG. 8 shows a top view corresponding to FIG. 7.

DESCRIPTION OF PREFERRED EMBODIMENTS

The N-type substrate of FIG. 5 is designed to support circuits made by means of CMOS technology, with P channel transistors (not shown) formed directly in the substrate and N channel transistors (not shown) formed in P-type wells diffused in the substrate.

According to the invention, one of these wells is used to form a structure for protecting a pad against the electrostatic discharges applied to this pad.

The N-type substrate is designated by the reference 40, the P-type well by the reference 42 and the pad to be protected by the reference 44.

The pad is connected to a surface metallization 46 insulated from the substrate both by a deposited insulator layer 48 and, at certain places, by an insulator layer 50 (generally called a field oxide layer) formed by thermal growth during the definition of the active zones of the integrated circuit.

The surface metallization 46 comes into contact locally with two doped surface regions in the well 42. These two regions are active zones of the substrate separated by a field oxide portion 50. The first surface region is a region 52 with P+ type doping, i.e. having the same type of conductivity as the well but with higher doping. The second region is an N+ type region 54.

The region 54 forms the emitter of an NPN type lateral bipolar transistor.

The structure according to the invention includes another N+ type doped region 56, separated from the region 54 by a narrow gap which is covered, in principle, with field oxide 50. The type of surface doping on this narrow gap 58 is the original doping of the well, i.e. P-type doping. It forms the base of the NPN lateral transistor. The N+ type region 56 forms the collector of this transistor. Although, in principle, the active regions are those that are not covered with field oxide 50, the base region 58 should be considered herein as an active region of the structure.

The collector region is contained in the P-type well. It is covered with a metallization 60 that is preferably connected to the high supply potential Vcc of the circuit. The N-type substrate is also connected to the high supply potential Vcc.

FIG. 6 shows a top view corresponding to FIG. 5. It shows the contours of the different diffusions and metallizations defined with reference to FIG. 5.

The contour 440 represents the contour of the pad to be protected 44, as it appears through a window opened in a passivation layer (not shown) covering the entire integrated circuit. The contour 440 is in fact the contour of this window.

The contour 460 is the contour of the metallization 46 connected to this pad and including this pad.

The contour 420 is the contour of the well 42. It is located beneath certain parts of the metallization 46 since this metallization comes into contact with the zones diffused within the well but, in principle, it is not located beneath the pad to be protected.

The contour 520 is the contour of the P+ type diffused region 52. The contour 525 is the contour of an aperture of the insulator layer 48, through which the metallization 46 can come into contact with the P+ type region 52.

The contour 540 is that of the N+ type emitter region 54 diffused in the well, and the contour 545 is that of an aperture in the insulator layer 48, through which the metallization 46 comes into contact with the emitter region.

In the same way, the contour 560 is that of the collector region 56, and the contour 565 is that of the window through which the metallization 60, connected to Vcc, comes into contact with the collector region.

Finally, the contour 600 is that of a metallisation line connected to the potential Vcc like the substrate.

The N+ type diffusions 54 and 56 are made as if these regions were drain or source regions of N channel MOS transistors of the integrated circuit. The P+ type diffusion 52 will be made as if it were a source or drain diffusion of a P channel MOS transistor of the circuit.

During positive electrostatic discharges on the pad to be protected, the PN junction between the P well and the N substrate will be conductive in forward bias. There may also be a conduction of the NPN lateral bipolar transistor. The pad is protected by the structure and the charges are removed towards, firstly, the substrate and, secondly, the metallization 60.

During negative electrostatic discharges on the pad to be protected, with respect to the substrate, the collector/base junction of the NPN lateral bipolar transistor will go into avalanche mode and trigger the conduction of the transistor. The charges are removed by the metallization 60. The structure works better than it would have done if it had a PNP type bipolar transistor, i.e. it can remove a greater quantity of energy.

However, it has been realised that, when there are great quantities of current to be removed, there remains a risk of localized destruction at the place where the current density is the greatest. It so happens that this place is generally located beneath the edges of the metallization 60 and, since the N+P junction is shallow at this place, there is a risk of causing it to be definitively short-circuited by diffusion of the metal of the contact in the semiconductor. This short-circuit takes the pad to be protected to the potential Vcc of the metallization, making the integrated circuit permanently unusable.

However it is not easy, as it was with respect to FIG. 4 for P-type substrates, to move the junction further below by means of an additional well. In CMOS technology, there is no step available for the diffusion of an N well with a depth in between that of the N+ drain and source diffusions and that of the P well.

The invention proposes a very simple structure to avert the risk of the short-circuiting of the insulating junction between the conductor 60 and the pad to be protected.

This structure is shown in a sectional view in FIG. 7 and in a top view in FIG. 8.

Instead of enclosing the collector region 56 integrally, the P-type well 52 encloses only a part of it, i.e. that part which is adjacent to the base region 58, but it does not enclose that part of the collector region 56 which comes into contact with the metallization 60. The contact is moved away laterally from the edge of the well.

The result thereof is that the edges of the metallization 60, at the place where it is in contact with the N+ type doped region, are located above an N+ type doped region which is itself located above the N-type substrate and not a P-type substrate.

The edges of the metallization 60 therefore do not overhang a shallow NP junction, nor even a deep NP junction. They overhang only a transition between two zones of the same type, namely N-type, which are differently doped and at the same potential (Vcc in principle).

As a consequence, even if the negative discharges at the pad 44 result in a current density such that there is localised fusion and migration of aluminum beneath the edges of the metallization 60, this will not result in the short-circuiting of the trench/substrate junction which normally provides for the insulation between the pad 44 to be protected and the potential Vcc.

The P+ type diffused region 52 remains, of course, within the well 42 since it is used to set up an ohmic contact to put the well at the potential of the pad 44.

The diffused emitter region 54 also remains inside the well to enable the formation of a lateral transistor within the well with the collector region 56 part that remains inside the well.

The distance between the edge of the metallization 60, at the place where it is in contact with the collector region 56, and the edge of the well should be sufficient for there to be no risk of short-circuiting the trench/substrate junction. This means, in practice, that the distance d between the edge of the metallization and the edge of the well is appreciably greater than the depth of the region 56 (a few tenths of a micrometer), for example several times this depth. This distance d may be of the order of the depth of the well 42 (a few micrometers).

FIG. 8 shows a top view of the protection structure of FIG. 7, using the same references as those of FIG. 5. It can be seen that the contour 420 of the well 42 is smaller than in FIG. 5. It comes partially beneath the contour 560 of the collector region, but not completely so. A part of the collector region 56 is outside the well, and it is in this part that the contour 565 of the contact between the metallization 60 and the collector region is found. The distance d between the contour 565 of the contact and the edge of the contour of the well 42 will be noted in FIG. 8.

What is claimed is:

1. An integrated circuit in CMOS technology with N substrate and P well, including a structure for the protection of a contact pad against electrostatic discharges, said protection structure comprising an NPN type lateral transistor formed in a P well, with an N+ type collector region and an N+ type emitter region superficially diffused in said P well and a base region also formed in said P well, the collector of the transistor being connected to a metallization, the emitter being connected to a pad to be protected, and a metallic ohmic contact being provided between the pad to be protected and the P-type well to take it to the potential of the pad, wherein the N+ type region forming the collector includes one part located within the P-type well and one part extending outside the well, the metallization coming into contact with the collector region in this external part.

2. An integrated circuit according to claim 1, wherein the base of the lateral NPN transistor is formed by a surface portion of the well, separating an N+ type doped region forming the collector and an N+ type doped region forming the emitter.

3. An integrated circuit according to claim 2, wherein the distance d between the metallization, at the place of the contact, and the P-type well is at least several times the depth of the collector or emitter region.

4. An integrated circuit according to claim 3, wherein the distance d is in the range of the depth of the P-type well.

5. An integrated circuit according to any one of the preceding claims, wherein the substrate and the metallization in contact with the collector region are taken to a high supply potential of the integrated circuit.

6. An integrated circuit according to any one of the claims 1 to 4, wherein the emitter and the collector of the NPN lateral transistor are made by diffusions identical to the source and drain diffusions of N channel MOS transistor made on the same substrate.

7. An integrated circuit according to any one of claims 1 to 4, wherein the ohmic contact between the pad to be protected and the P-type well is set up by a P+ type diffusion identical to source and drain diffusions of P channel MOS transistors made on the same substrate.

* * * * *